United States Patent [19]
Ovshinsky et al.

[11] Patent Number: 5,714,768
[45] Date of Patent: Feb. 3, 1998

[54] SECOND-LAYER PHASE CHANGE MEMORY ARRAY ON TOP OF A LOGIC DEVICE

[75] Inventors: Stanford R. Ovshinsky, Bloomfield Hills; Guy C. Wicker, Southfield, both of Mich.

[73] Assignee: Energy Conversion Devices, Inc., Troy, Mich.

[21] Appl. No.: 547,349

[22] Filed: Oct. 24, 1995

[51] Int. Cl.$^6$ .............................. H01L 29/06; H01L 47/00
[52] U.S. Cl. .................... 257/40; 257/4; 257/673; 257/686; 257/777
[58] Field of Search ................ 257/40, 686, 673, 257/777, 724, 3, 4, 5, 613; 326/104, 96, 136; 365/51, 52, 63; 361/684, 735, 790, 789, 784, 783

[56] References Cited

U.S. PATENT DOCUMENTS 5,432,729  7/1995  Carson et al. ..................... 257/777

Primary Examiner—Carl W. Whitehead, Jr.
Attorney, Agent, or Firm—David W. Schumaker; Marvin S. Siskind; Marc J. Luddy

[57] ABSTRACT

The present invention is a computational unit comprising a logic processing device, and a memory array deposited on top of and communicating with the logic processing device. More specifically, the present invention is a computational unit comprising a logic processing device, and electrically erasable phase change memory deposited on top of and communicating with the logic processing device.

23 Claims, 5 Drawing Sheets

SECOND-LAYER PHASE CHANGE MEMORY ARRAY ON TOP OF A LOGIC DEVICE

FIELD OF THE INVENTION

This invention relates generally to a uniquely designed solid state, electrically operated, directly overwritable, low energy, fast switching, non-volatile, analogue and multilevel single-cell operating memory element, and to high density electrical memory arrays fabricated from these elements. Specifically, the present invention relates to the deposition of the above memory array on top of a logic processing device which may be comprised of threshold switches.

BACKGROUND OF THE INVENTION

Logic processing devices, such as a computer's central processing unit (CPU), comprises logic units (such as arithmetic logic units, adders, fetch units, etc.), internal memory, and device drivers (which provide a means of communication between the logic units and the memory arrays). CPU internal memory comprises registers (used for data storage, debugging, and memory management), internal cache memory (for storing instructions and data that can be quickly accessed by the logic units of the CPU), and ROM (for such non-volatile applications as microcode storage).

An important goal in CPU design is to optimize the efficiency of the chip. While the overall efficiency of a CPU depends on many factors, the amount of internal memory placed on a CPU chip is important since access to internal memory is faster than access to memory external to the CPU. For example, placing cache memory on a CPU, close to the logic units, provides the logic units with quicker access to required instructions and data.

Embedded memory is conventional memory technology (such as DRAM, SRAM and ROM) placed on the same layer of silicon with the logic units and device drivers that comprise a logic processing device. Conventional memory devices comprise the same electronic components (i.e. transistors, resistors, capacitors, metal contacts, etc.) that make up the logic units and device drivers of a CPU. Consequently, the conventional memory elements embedded onto a CPU chip are placed on the same monolithic integrated circuit and are located in the same planar surface of the silicon as the logical units and the device drivers. Hence, the amount of chip area used by a CPU increases as the amount of embedded CPU memory increases.

Thus, while placing memory on the CPU increases processing efficiency, using conventional memory to do so increases the size of the integrated circuit which subsequently increases the manufacturing costs of chip. To keep CPU costs at a reasonable level, the amount of embedded memory is kept to a minimum, which consequently affects CPu performance. To augment CPU performance at a lower cost, fast static memory chips (SRAM) are often used in a secondary cache configuration external to the CPU. Such a secondary cache, however, does not provide the same performance as primary, internal cache memory due to the delay associated with transferring information between the CPU chip and the external memory chips. Hence, because use of conventional memory is restricted by CPU chip size and manufacturing costs, the efficiency of the CPU is limited and constrained.

One object of the present invention is to provide a high speed, high density, non-volatile memory array that can be incorporated on top of the device drivers and logic units of a logic processing device (such as a central processing unit) as a second layer. Such "second-layer" memory array would permit increased performance of the logic processing device at a reduced cost, without increasing the size of the CPU footprint.

Another aspect is of the present invention is incorporating the same high speed memory array discuss above on top of a logic processing unit that comprises threshold switching logic.

SUMMARY OF THE INVENTION

These and other objects of the present invention are achieved by a computational unit comprising a logic processing device, and a memory array deposited on top of and communicating with the logic processing device, other objects of the present invention are achieved by a computational unit comprising a logic processing device, and electrically erasable phase change memory deposited on top of and communicating With the logic processing device.

DETAILED DESCRIPTION OF THE INVENTION

Figure 1:
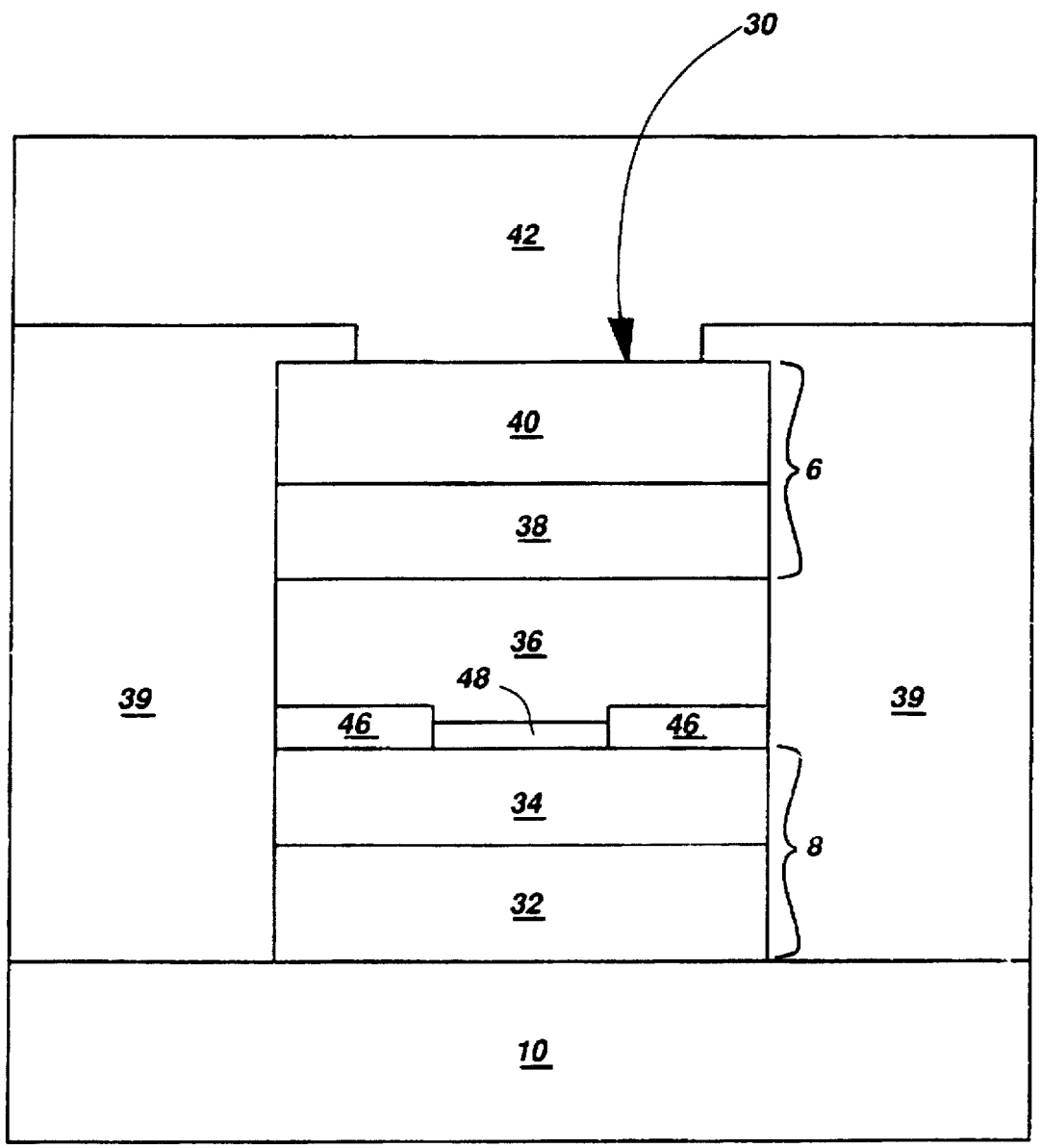
FIG. 1 is a cross-sectional view of a single memory element.

The present invention is a computational unit comprising a logic processing unit and a memory array deposited on top of and communicating with the logic processing device. Generally, the logic processing device can be any integrated circuit comprising logic units for data and instruction processing as well as device drivers used as a means of communications between the logic processing device and the memory array.

The logic processing device can be comprised of a semiconductor material. This includes elemental and compound semiconductors. The preferable semiconductor material is silicon, however, other materials, such as Gallium Arsenide, are also feasible.

The logic processing device can also be comprised of two-terminal chalcogenide switches. An example of a two-terminal chalcogenide switch is the Ovonic Threshold Switch (OTS). The OTS is described in detail in U.S. Pat. No. 5,177,567, the contents of which are hereby incorporated by reference. The application of OTS to computer logic circuitry is described in detail in U.S. patent application 08/386,902, the contents of which are incorporated by reference.

The memory array deposited on top of the logic processing device is a "second-layer" memory array. Generally, a second-layer memory array can be any type of memory that can be stacked on top of a logic processing device to form a second layer. This includes all inorganic and organic, memories known in the art. Preferably, the second-layer memory array is comprised of electrically erasable, directly overwritable, multibit single cell memory elements such as Ovonic memory. Ovonic memory devices and arrays fabricated from them are described in detail in U.S. Pat. Nos. 5,166,758, 5,296,716, 5,335,219, 5,341,328, 5,359,205 5,406,509, 5,414,271, and U.S. patent applications 08/506,630 and 08/517,313, the contents of which are hereby incorporated by reference.

Ovonic memory is electrical phase change memory that is an erasable, high performance, thin-film electronic memory device. Its advantages include non-volatile storage of data, potential for high bit density, high switching speed, and a manufacturing process that requires only low temperature deposition.

In contrast to such conventional memory devices as DRAM, SRAM and ROM, no field effect transistor devices are required in Ovonic memory devices. The electrically erasable, directly overwritable memory elements of the Ovonic memory array represent the simplest electrical memory device that can be fabricated known in the art. Ovonic devices comprise only two electrical contacts to a monolithic body of thin-film chalcogenide material and a rectifier for isolation.

Ovonic memory arrays comprise a plurality of electrically activated, directly overwritable multibit single-cell memory elements that are disposed in rows and columns onto the logic processing device. Each of the memory elements comprises a volume of memory material that define a single cell memory element. This memory material is characterized by (1) a large dynamic range of electrical resistance values, (2) the ability to be set at one of a plurality of resistance values within the dynamic range in response to selected electrical input signals so as to provide the single cell with multibit storage capabilities, and (3) at least a filamentary portion of the single cell memory element is setable by the selected electrical signal to any resistance value in the dynamic range, regardless of the previous resistance value of the material. Each of the memory elements further comprises a pair of spacedly disposed contacts for supplying the electrical input signal to set the memory material to a selected resistance value within the dynamic range.

Ovonic memory material is formed from a plurality of constituent atomic elements, each of which is present throughout the entire volume of memory material. The plurality of constituent atomic elements which form the volume of memory material includes elements selected from the group consisting of Te, Se, Ge, Sb, Bi, Pb, Sn, As, S, Si, P, O and mixtures or alloys thereof. Preferably, the constituent atomic elements includes at least one chalcogenide element and may include at least one transition metal element. The term "transition metal" as used herein includes elements 21 to 30, 39 to 48, 57 and 72 to 80.

More preferably, the chalcogenide element includes Te and Se, and the transition metal element includes Cr, Fe, Ni, Pd, Pt, Nb and mixtures of alloys thereof. Most preferably the transition metal element is Pd. Specific examples of such multi-element systems are set forth hereinafter with respect to the Te:Ge:Sb system with or without Pd and/or Se.

It has been determined that compositions in the highly resistive state of the class of Te:Ge:Sb materials which meet the criteria of the present invention are generally characterized by substantially reduced concentrations of Te relative to that present in prior art electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 40% to 58% Te. Concentrations of Ge were above about 5% and ranged from a low of about 8% to about 30% average in the material, remaining generally below 50%. The remainder of the principal constituent elements in this composition was Sb. The percentages given are atomic percentages which total 100% of the atoms of the constituent elements. Thus, this composition may be characterized as $Te_aGe_bSb_{100-(a+b)}$. These ternary Te-Ge-Sb alloys are useful starting materials for the development of additional memory materials having even better electrical characteristics.

Figure 4:
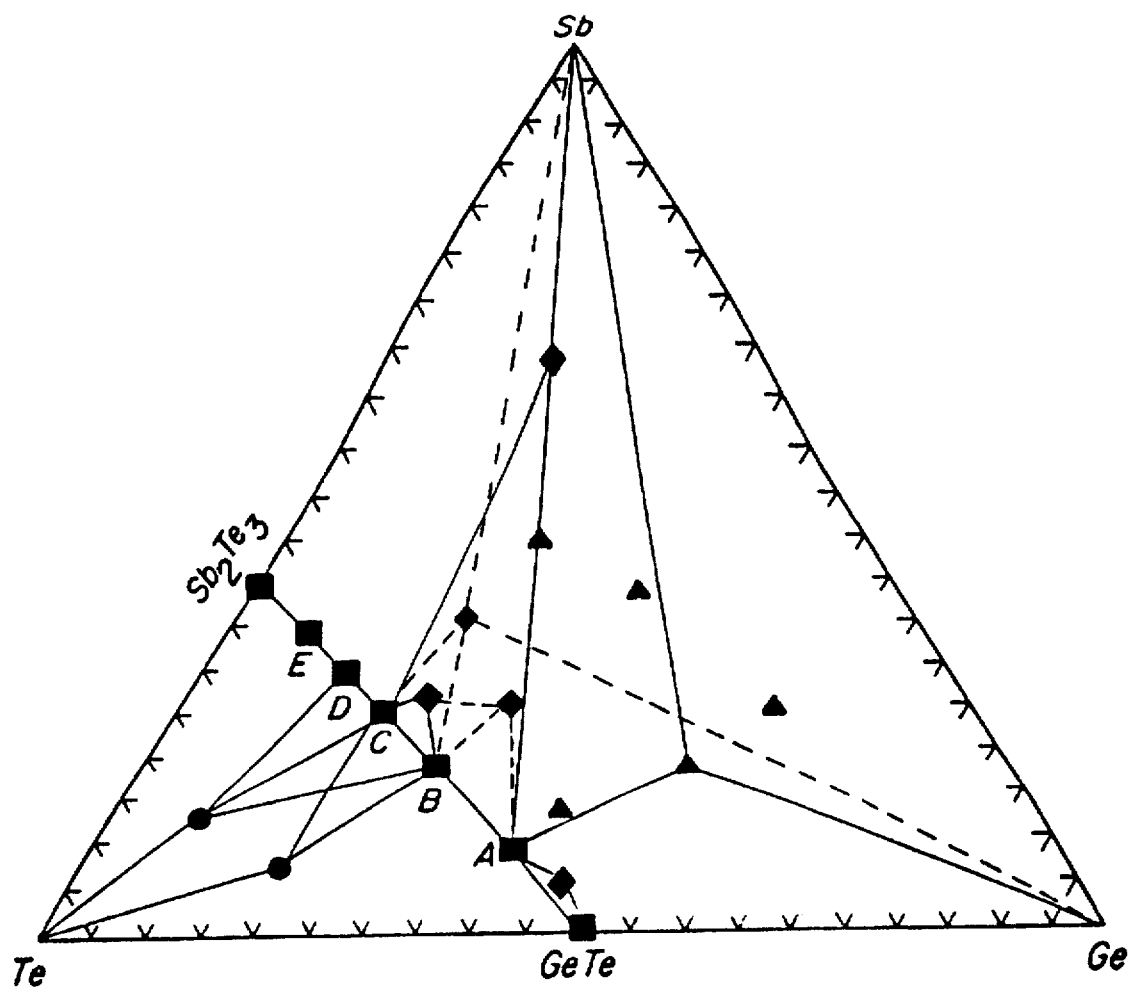
FIG. 4 is the ternary phase diagram of the Ge:Sb:Te alloy system from which the memory elements of the instant invention are fabricated.

A ternary diagram of the Te:Ge:Sb system is shown in FIG. 4. Melts were prepared from various mixtures of Te, Ge and Sb, the melts segregated into multiple phases upon rapid solidification. Analysis of these rapidly solidified melts indicated the presence of ten different phases (not all present in any one rapidly solidified melt). These phases are: elemental Ge, Te and Sb, the binary compounds GeTe, and $Sb_2Te_3$ and five different ternary phases. The elemental compositions of all of the ternary phases lie on the pseudo-binary $GeTe-Sb_2Te_3$ line and are indicated by the reference letters A, B, C, D and E on the ternary diagram shown in FIG. 4. The atomic ratios of the elements in theses five ternary phases are set forth in Table 1. A more detailed description of FIG. 4 is presented hereinbelow.

TABLE I

Observed Ternary Crystalline Phases of the TeGeSb System

| Desiqnation | At % Ge | At % Sb | At % Te |
|---|---|---|---|
| A | 40 | 10 | 50 |
| D | 26 | 18 | 56 |
| C | 18 | 26 | 56 |
| D | 14 | 29 | 57 |
| E | 8 | 35 | 56 |

The novel memory elements of the present invention include a volume of memory material, said memory material preferably including at least one chalcogen and can include one or more transition metals. The memory materials which include transition metals are elementally modified forms of our memory materials in the Te-Ge-Sb ternary system. That is, the elementally modified memory materials constitute modified forms of the Te-Ge-Sb memory alloys. This elemental modification is achieved by the incorporation of transition metals into the basic Te-Ge-Sb ternary system, with or without an additional chalcogen element, such as Se. Generally the elementally modified memory materials fall into two categories.

First is a memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te-Ge-Sb ternary system and c is between about 90 and about 99.5%. The transition metal can preferably include Cr, Fe, Ni, Pd, Pt, Nb and mixtures of alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22Sb22})_{\underline{8}}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

Second is a memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements. TM is one or more transition metals, a and b are as set forth hereinabove for the basic Te-Ge-Sb ternary system, c is between about 80 and 99% and d is between about 0.5 and 10%.

The transition metal can preferably include Cr, Fe, Ni, Pd, Pt, Nb and mixtures of alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The memory elements possess substantially non-volatile set resistance values. However, if the resistance value of the instant memory elements does, under some circumstances, drift from its original set value, "compositional modification", described hereinafter, may be used to eliminate for this drift. As used herein, the term "non-volatile" will refer to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the volume of memory material to yield substantially stable values of resistance, including the addition of band gap widening elements to increase the inherent resistance of the material. One example of compositional modification is to include graded compositional inhomogeneities with respect to thickness. For instances, the volume of memory material may be graded from a first Te-Ge-Sb alloy to a second Te-Ge-Sb alloy of differing composition. The compositional grading may take any form which reduces set resistance value drift.

For example, the compositional grading need not be limited to a first and second alloy of the same alloy system. Also, the grading can be accomplished with more than two alloys. The grading can be uniform and continuous or it can also be non-uniform or noncontinuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te-Ge-Sb alloy. Again, as was the case with graded compositions, any combination of layers which results in substantially reduced resistance value drift dan be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volume of memory material which employ this combination are: (1) a volume of memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

Referring to FIG. 1, shown is a cross-sectional view of a memory element of the present invention formed on a substrate 10. The substrate may be the logic processing device described herein. The memory element 30 includes the memory material 36 and a pair of spacedly disposed contacts, 6 and 8, for supplying the electrical input signal to the memory material.

Each of the spacedly disposed contacts can be comprised of two thin-film layers. Layers 34 and 38, deposited adjacent to the memory material, have excellent diffusion barrier properties which inhibit the migration of foreign material into the chalcogenide memory material 36. In one embodiment, the adjacent thin-film layers 34 and 38 were both comprised of amorphous carbon, amorphous silicon or a dual amorphous carbon/amorphous silicon structure. In other embodiments, at least one of the adjacent thin-film contact layers have been comprised of a thin-film layer formed from a compound which includes one element selected from the group consisting of Ti, V, Cr, Zr, Nb, M, Hf, Ta, W, and two elements selected from the group consisting of B, C, N, O, Al, Si, P, S. In one embodiment, at least one of the adjacent thin-film contact layers is composed of titanium carbonitride. In another embodiment, at least one of the adjacent thin-film layers is composed of titanium siliconitride. The titanium carbonitride and the titanium siliconitride have excellent barrier properties, preventing both the diffusion and electromigration of foreign material into the chalcogenide memory material.

The layers of the titanium siliconitride and titanium carbonitride may be deposited by such methods as physical vapor deposition including evaporation, ion plating as well as DC and RF sputtering deposition, chemical vapor deposition, and plasma assisted chemical vapor deposition. The exact method used depends upon many factors, such as deposition temperature constraints imposed by the composition of the chalcogenide target material. The layers of either titanium carbonitride or titanium siliconitride are preferably deposited to a thickness of about 100 Å to 2000 Å. They are more preferably deposited to a thickness of about 200 Å to 1000 Å.

The pair of spacedly disposed contacts 6 and 8 preferably comprise the additional thin-film layers 32 and 40 which are deposited remote to the chalcogenide memory material. Each of these remote thin-film layers comprises one or more elements from the group consisting of Ti, W and Mo. In one embodiment, each of the remote thin-film layers is comprised of Ti and W. The Ti-W alloy layers 32 and 40 are preferably deposited using a DC sputtering deposition process. They are preferably deposited to a thickness of about 100 Å to 4000 Å. They are more preferably deposited to a thickness of about 200 Å to 2000 Å. The Ti-W alloy layers 32 and 40 have excellent ohmic contact properties. Moreover, they have the barrier properties necessary to prevent both the electromigration and diffusion of foreign electrode material into the chalcogenide memory material.

The layer of memory material 36 is formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation. Typical deposition parameters for RF sputtering and evaporation of the chalcogenide layer 36 are set forth below in Tables 2 and 3, respectively. The layer of memory material 36 is preferably deposited to a thickness of about 200 Å to 5,000 Å, more preferably of about 250 Å to 2,500 Å and most preferably of about 400 Å to 1,250 Å in thickness.

TABLE 2

RF Sputtering Deposition Parameters

| Parameter | Typical Range |
| --- | --- |
| Base pressure | $8 \times 10^{-7} - 1 \times 10^{-6}$ Torr |
| Sputtering gas (Ar) pressure | 4–8 m Torr |
| Sputtering power | 40–60 watts |
| Frequency | 13–14 MHz |
| Deposition Rate | 0.5–10 Å/second |
| Deposition Time | 2–25 minutes |
| Film Thickness | 250–1500 Å |
| Substrate Temp. | Ambient - 300° C. |

TABLE 3

Evaporation Deposition Parameters

| Parameter | Typical Range |
| --- | --- |
| Base pressure | $1 \times 10^{-6} - 5 \times 10^{-6}$ Torr |
| Evaporation Temp. | 450–600 °C. |
| Deposition Rate | 2–4 Å/second |
| Deposition Time | 2–20 minutes |
| Film Thickness | 250–1500 Å |
| Substrate Temp. | Ambient–300° C. |

The term "pore diameter" as used herein generally means the average cross-section of the smallest region of contact between the memory material 36, and the electrical contact layers 6 and 8. The pore diameter of memory material 36 is less than about one to two micrometers or so, although there is no practical limit on the lateral dimension. It has been determined that the diameter of the actual conductive path of the high conductivity material is significantly less than a micrometer. The pore diameter can thus be as small as lithography resolution limits will permit and, in fact, the smaller the pore, the lower the energy requirements for electrical switching.

It is preferred, that the pore diameter be selected such that it conforms substantially with the cross section of the memory material whose resistance is actually altered when the material is switched to either the high or low resistance state. The pore diameter of the memory material 36 is therefore preferably less than about one micrometer do that the volume of the memory material 36 is limited, to the extent lithographically possible, to that volume of material 36 which is actually switched between the various states of resistance. This further reduces the switching time and electrical energy required to initiate the detectable change in resistance. Ideally, the pore diameter should equal the diameter of the filament formed when the switching material is in the dynamic state.

It is further preferred that the pore region of memory element 30 be thermally isolated and/or controlled except for such electrical contact with the upper and lower electrodes as is necessary for proper operation. This confines, limits and controls the heat transfer from the switched volume of the pore as well as the electrical energy required for resistance transitions. Such thermal isolation is accomplished in the embodiment of FIG. 1 by insulation material 39 which surrounds the lateral periphery of the memory element 30.

We observe a trend in performance of the memory elements that is generally related to pore diameter. When the device is used in the binary mode, we see a general increase in the off-to-on resistance ratio as we test devices across a wafer in which pore diameters range systematically from just over one micron to not open at all. If the pore diameter is controlled within the range of, for example, from one micron to about one-sixth of a micron, there is an opportunity to improve the performance of our devices. Since factors such as current density and energy density are important in the programming of our devices, reduction in device volume, resulting from reduction in pore diameter, should result in an increase in sensitivity and speed. To minimize set energy/current/voltage, pore diameters of as small as 1500 Å, or even as small as 100 Å may be employed.

Memory elements of the instant invention which employ a filament confining means 48 between at least one of the spacedly disposed contacts and the volume of memory material provides for memory elements with better thermal stability, lower set/reset current requirement's, longer cycle life, and a larger dynamic range of resistances. Typically, the filament confining means is a thin-film layer disposed between one of the spacedly disposed contacts and the volume of memory material. Preferably this thin-film layer is between 10 Å and 100 Å thick. This thin-film layer is formed of a highly resistive material and has at least one low resistance pathway thereacross through which electrical signals pass between the electrical contact and the volume of memory material. The area of the low resistance pathway in the highly resistive thin-film layer may be less than about 2 percent of the total area of contact between the thin-film layer and the volume of memory material. An exemplary thin film-layer is formed of a silicon nitride material which includes silicon, nitrogen and hydrogen. The composition of this film is preferably, in atomic percent, between about 30–40% silicon, 40–50% nitrogen and up to 30% H.

Figure 2:
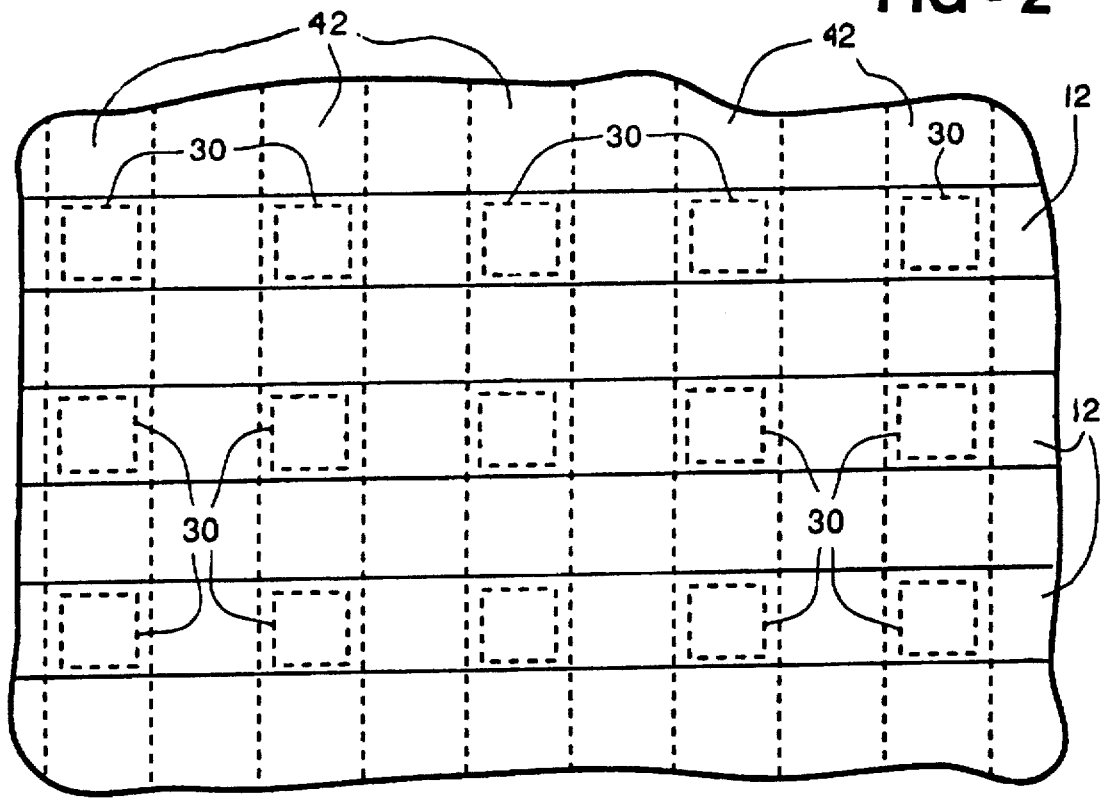
FIG. 2 is the top view of a possible layout of multiple memory elements showing how the elements would be connected to a set of X-Y addressing lines.

The memory element shown in FIG. 1 may be formed in a multi-step process. Layers 32, 34 and 46 are first deposited and the insulation layer 46 is etched to form the pore. The remaining layers 48, 36, 38 and 40 are deposited and the entire stack of layers 32, 34, 46, 48, 36, 38 and 40 is etched to the selected dimension. Deposited on top of the entire structure is a layer of insulating material 39 of $SiO_2$ or $Si_3N_4$. This is etched and, as shown in FIG. 2, a layer of aluminum is deposited to form the second electrode grid structure 42 which extends perpendicular in direction to the conductors 12 to complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin deposited and baked after deposition in accordance with known techniques to form the encapsulant layer.

Conventional CMOS technology cannot be used to produce this type of stacked memory configuration since CMOS technology builds the required semiconductor devices into the bulk of single crystal semiconductor wafers and, therefore, can only be used to fabricate a single layer of devices. Furthermore, (1) CMOS cannot produce a small enough footprint (actual element dimension) to effectively produce large arrays at comparably low cost and (2) CMOS devices, because they exist in a single plane, cannot be interconnected along the Z direction. Therefore, CMOS devices cannot be fabricated with the complex, three-dimensional interconnectivity required for advanced parallel processing computers. The three-dimensional, thin-film memory array structures of the instant invention, on the other hand are capable of both conventional serial information processing as well as parallel information processing.

Parallel processing and therefore multidimensional memory array structures are required for rapid performance of complex tasks such as pattern recognition, classification or associative learning etc. Further uses for and description of parallel processing are presented in U.S. Pat. No. 5,159,661 which is assigned to the assignee of the instant application and the disclosure of which is hereby incorporated by reference. With the integrated structure as shown in the embodiment of FIG. 1; however, a completely vertically integrated memory structure can be formed, thus minimizing the area occupied on the substrate. This means that the density of the memory elements in the chip is limited essentially only by the resolution capabilities of the lithography.

The top view of a possible configuration for multiple memory elements is shown in FIG. 2. As shown, the devices form an X-Y matrix of memory elements. The horizontal strips 12 represent the X set of an X-Y electrode grid for addressing the individual elements. The vertical strips 42 represent the Y set of addressing lines.

Other circuit configurations for the electrically erasable memory are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 3:
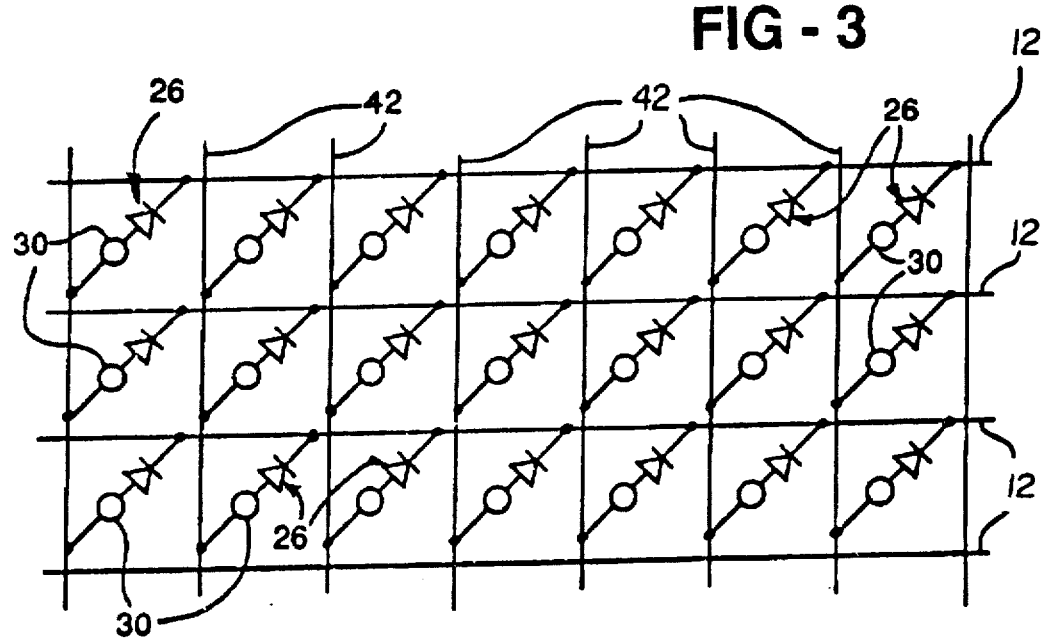
FIG. 3 is a schematic diagram of the memory elements from FIG. 2 showing, in addition, how isolation elements such as diodes are connected in series with the memory elements to electrically isolate each of the devices from the others.

Each memory element is electrically isolated from the others by using some type of isolation element. FIG. 3, a schematic diagram of the memory device layout, shows how electrical isolation can be accomplished using diodes. The circuit comprises an X-Y grid with the memory elements 30 being electrically interconnected in series with isolation diodes 26. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

In prior art semiconductor memories having the relatively high switching speeds and low switching energies deemed necessary for most applications thereof, at least one transistor and charge storage element is required for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these can be made in vertical relationship to each other. Further, each memory element, complete with isolating diode and the pair of contacts for the element, is itself fully vertically integrated such that a significantly higher bit density is possible. In fact, the memory of the present invention provides for a bit density which is greater than that attainable even in solid state dynamic random access memories (DRAMs), which are volatile and therefore lack the further advantages that the non-volatility attainable with the present invention provides. The increase in bit density attainable with the present invention translates into a corresponding reduction in manufacturing costs because of the smaller areas of the wafer occupied per bit of the integrated circuit configuration. This allows the memory of the present invention to compete with and surpass other available memories for a wider range of applications, not only in terms of electrical performance and memory storage capacity, but also in terms of cost. By comparison with prior art semiconductor memories formed of at least one transistor and a capacitor for each bit, the integrated circuit configurations of the present invention, as shown in FIG. 1, can be formed on a chip with greater bit density compared to prior art configurations using the same photo lithographic resolution. In addition to the cost advantages that the higher bit density affords, the elements are positioned closer together and lead lengths, capacitances, and other related parameters are further minimized, thereby enhancing performance.

Because of the characteristics discussed above; and unlike the conventional memory that is embedded in many state-of-the-art logical processing units, Ovonic memory is not be confined to the same layer of silicon that comprises the logic units and device drivers. Thus, Ovonic memory is particularly suited for incorporation on top of the silicon layer of a logical processing device. In particular, Ovonic memory can be incorporated on top of a silicon chip in the present invention because Ovonic memory arrays can be fabricated using low temperature deposition techniques, such as physical vapor deposition including evaporation and ion plating as well as DC and RF sputtering deposition, chemical vapor deposition, and plasma assisted chemical vapor deposition. The use of low temperature deposition processes allows Ovonic memory to be deposited on top of existing silicon logic without destroying the underlying logic devices. The exact method used to deposit the Ovonic memory array of the present invention on top of a logic processing device depends upon many factors such as deposition temperature constraints imposed by the composition of the logic processing device being used.

Thin-film Ovonic memory arrays may also be incorporated on top of logic processing devices comprising a logic family using two-terminal chalcogenide switches as logic gates. Preferably, the two-terminal chalcogenide switches are chalcogenide threshold switches. A logic family is defined as a set of all possible logic circuits which can be formed using a particular logic gate or switching element.

A logic family has a number of fundamental requirements necessary for use in logic processing devices. First, it must be able to convert a binary "one" to a binary "zero" and vice versa. This is called inversion. Second, it must be able to perform such common logical operations as AND, OR, NAND, NOR, etc. Third, the logic family must have the ability to produce gain. That is, the output from one logic circuit must have the ability to provide input for more that one other circuit at the same time. Finally, if the logic gate or switching element has a latching property (i.e. the device does not automatically shut off, but must be turned off), means must be provided for resetting the gate/switch for subsequent switches. The logic family based on two-terminal chalcogenide switches meets the above requirements for use in logic processing devices.

One consideration mentioned above is a gate's/switch's latching property. A two-terminal chalcogenide threshold switch, such as the Ovonic Threshold Switch (OTS), has such a latching property. In fact, Ovonic logic differs from conventional transistor logic in that the OTS is a true switching device. That is, once its threshold voltage is reached, an OTS switches on and current is allowed to pass through. Once switched on, an OTS remains on until the current passing there falls below a critical value known as the holding current. This necessitates a clocked power supply for the logic gate.

In order to effectively use such a system, the clock for a stage of logic must be activated before the logic will switch into the desired state. The next stage of logic requires signals from this stage, so the clock must remain active while the clock of the second stage is activated. After this, the signal is no longer required and the clock of the first stage can be turned off until the first stage of logic is required again.

There are at least three phases of logic required for the system (i.e. three-phase clocking). These phases include: 1) switching the gate, 2) transferring the signal to the next signal to the next stage, and 3) resetting the gate. More clock phases could be added, and may be desirable to reduce the duty cycle of the logic gates.

Figure 5:
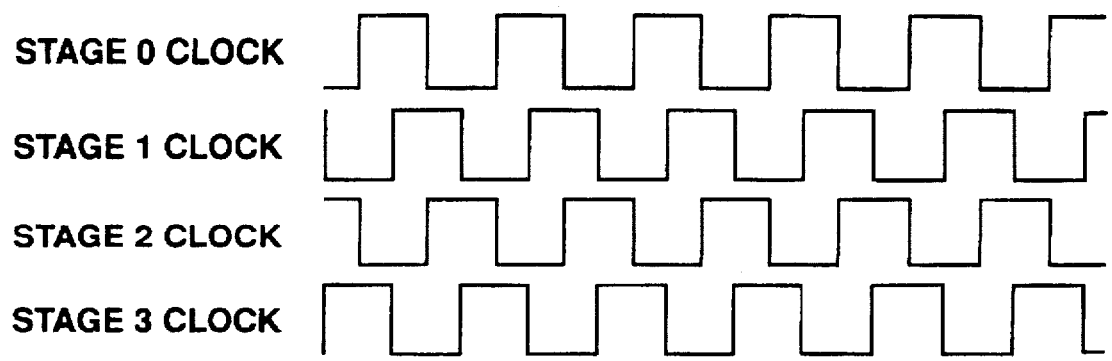
FIG. 5 depicts the power cycling of a four-phase clocking cycle for instituting two terminal logic, specifically shown is a four-phase clocking cycle where each subsequent clocking wave is 90 degrees out of phase from the previous clocking wave.
Figure 6:
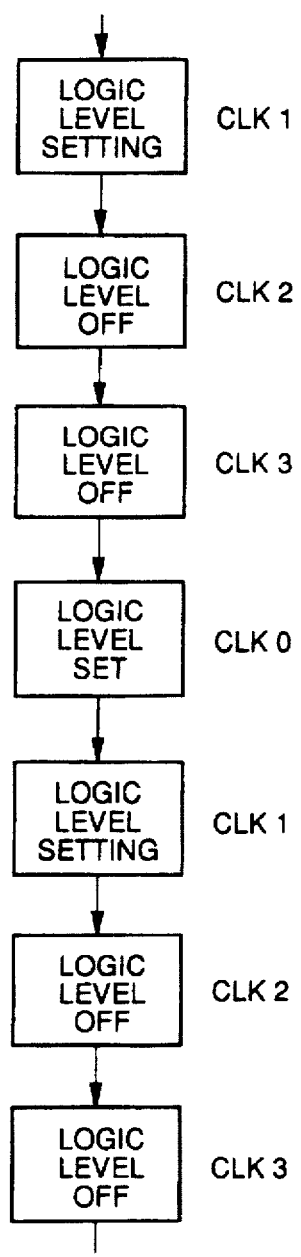
FIG. 6 depicts the manner in which four-phase clocking allows the logical output of a logic circuit to be passed to the next logic circuit in a logic chain without affecting other logic circuits in the logic chain.

To insure that the logic gate/OTS turns off when required, the current passing therethrough must be stopped. This is accomplish by a four-phase clocking system. FIG. 5 shows the power signals for a four-phase clocking system. It can be seen that the four stages of the clocking system are each 90 degrees out of phase from the stage preceding it. This four-phase clocking system allows for proper transfer of data from one logic circuit to the next. To visualize just how this is accomplished, look at the flow chart depicted in FIG. 6. The clock cycle is at a point at which both the stage 0 and stage 1 clocks are powered and the stage 3 and stage 4 clocks are unpowered. At this point the logic circuit being supplied by clock 0 have performed their logical function and are transferring their output to the next logic circuit(s) in their logic path, which are powered by the stage 1 clock. Therefore, the logic circuits powered by the stage 1 clock are said to be "being set". It should be noted that since both the stage 2 and 3 clocks are unpowered during this time period, each logic circuit and its OTS is closed and no information is passed into or out of these circuits (thus aiding in providing for noise immunity). Once the stage 1 clock logic circuits are set, the stage 0 clock is powered down and the stage 2 clock is powered up. Now the logical output of the stage 1 clock logic circuits is passed to the stage 2 clock logic circuits. Then the stage 1 clock is powered down and the stage 3 clock is powered up. The cycle is then completed by powering down the stage 2 clock and powering up the stage 0 clock again. While FIG. 5 depicts four-phase clocking of equal on and off duration (i.e. a 50% duty cycle) with each phase being offset by 90 degrees from the preceding clock, there are many other ways to implement four-phase clocking. Four-phase clocking is well known in the two-terminal logic art and is described by W. F. Chow, "Principles of Tunnel Diode Circuits", John Wiley & Sons, Inc. 1964, pp. 253–254.

Figure 7:
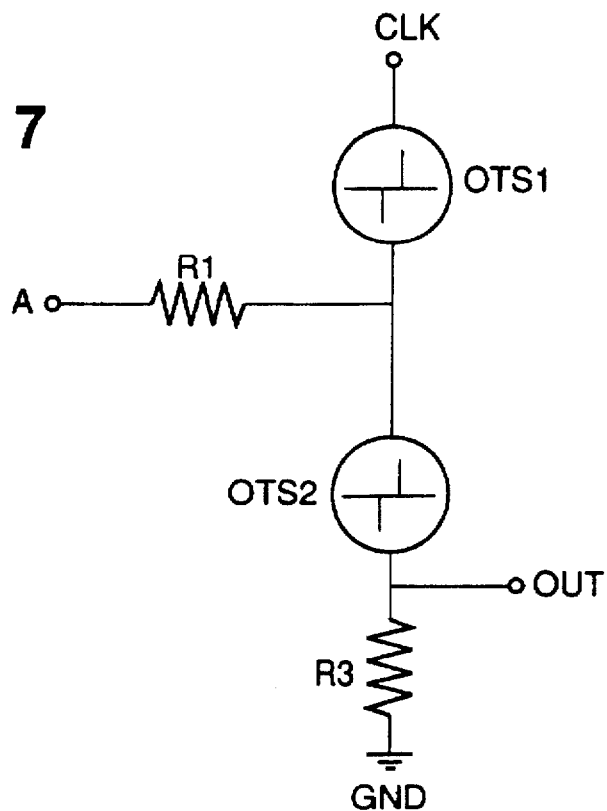
FIG. 7 depicts a single input inverting buffer by inverting the input and providing the boosted inverted signal as the output.

Another one of the technical requirements is the ability to convert a binary "one" to a binary "zero" and vice versa. This is known as INVERSION. FIG. 7 depicts a circuit which provides the instant logic family with the INVERSION ability. This circuit may also be thought of as an inverting buffer, since the signal is merely inverted and passed to the next circuit, having had no logical operation performed upon it. The circuit includes two OTS's OTS1 and OTS2 which are connected in series. A data input point A is connected to an input resistor R1, which is in turn connected between the two OTS's. The power clocking signal is input at the CLK terminal of OTS1 which is opposite the junction point of R1, OTS1 and OTS2. The terminal of the second switch OTS2 which is opposite that of the R1-OTS1-OTS2 junction point is connected to ground (GND) through a resistor R2. A data output point is connected between the second switch OTS2 and the R2 resistor. In general, the resistance value of R1 is much greater than the resistance value of R2. During the operation of this circuit the clock is high, i.e. the circuit is powered and the potential at CLK is high. Accordingly, if the input signal at A is also high, there is not enough potential across OTS1 to cause it to switch, i.e. exceed its threshold voltage. There is also not a large enough potential across OTS2 to cause it to switch. Therefore, the potential of the output at OUT is low. Conversely, if the input signal at A is low, there is a large enough potential across OTS1 to exceed its threshold and the impedance of the switch drops. This then creates a large enough potential across OTS2 to allow it to switch and the potential of the output signal is pulled high.

Figure 8:
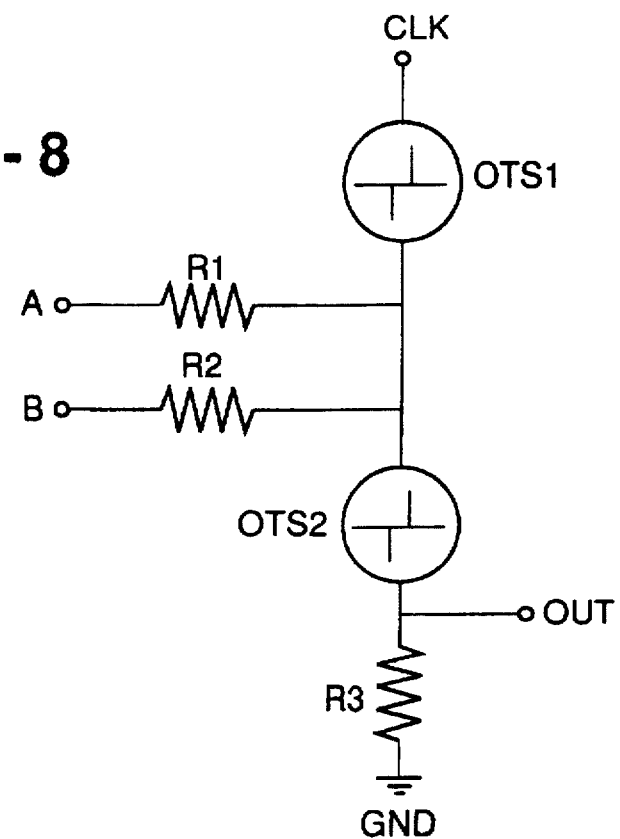
FIG. 8 depicts a multiple input logic circuit which performs a logical operation using two terminal chalcogenide switches, this circuit also performs an inversion and provides gain.

Yet another of the technical requirements for a logic family is the ability to perform a logical operation. FIG. 8 depicts a circuit within the instant logic family which fulfills this requirement. The circuit is basically the same circuit as the INVERSION circuit of FIG. 7 except that there is an additional input B with its attendant input resistor. Therefore, there are two inputs A and B each having their respective input resistors R1 and R2. The ground resistor has been designated R3 in this circuit. As in the INVERSION circuit, the resistance values of resistors R1 and R2 are much larger than the resistance value of ground resistor R3. This circuit operates in much the same manner as the INVERSION circuit of FIG. 7, the main difference being that there are now two inputs and a logical operation is performed upon the inputs. Again during operation of this circuit the potential at CLK is high. If the input at either A or B is high or the input at both A and B are high, OTS1 does not switch. Therefore OTS2 does not switch and the output is low. However if the input at both A and B is low, OTS1 switches. This causes the potential across OTS2 to be high causing it to switch and pulling the output at OUT high.

Therefore, depending upon the nomenclature used, this is either a NOR gate or a NAND gate. That is, if a low potential is a logical "0" and a high potential is a logical "1" then the circuit acts as a NOR gate. Conversely, if a low potential is a "1" and a high potential is a "0" then the circuit acts a NAND gate.

The last technical consideration is that the logic family must have the ability to produce gain. The circuits described above inherently produce gain. That is, the output at OUT of each of the aforedescribed circuits is pulled to nearly the potential of the clock powering signal, i.e. the potential at CLK, with an impedance substantially lower than the input impedance. No special additional gain circuitry is required.

Therefore, all of the fundamental requirements of a logic family have been met. While the instant disclosure has presented specific circuitry which belong to the present logic family, they are merely exemplary and are not intended to limit the scope of the invention. One skilled in the art will recognize that there are a multitude of other circuits within the instant logic family which can be created to perform similar tasks to those disclosed.

The incorporation of thin-film Ovonic memory on top of logic processing units to form second-layer memory offers tremendous advantages. As mentioned earlier, state-of-the-art central processing units are being designed with an increasing amount of memory placed on the same chip as the logic units and device drivers. This is done to place as much fast memory as possible in close proximity to the logical units which need fast access instructions and data. Types of memory placed on the central processing unit chip include registers, data and instruction cache, and microcode ROM.

Incorporation of high density arrays of Ovonic memory on top of a central processing unit chip will place registers, cache and microcode in close proximity to the logic without increasing the size and cost of the chip. In particular, the non-volatility of Ovonic memory will allow microcode to be either permanently stored or dynamically altered to revise the CPU instruction set. The distinction in the CPU between registers, cache, and microcode can be eliminated by incorporating all of these functions in the same memory array. Eliminating the distinction between separate levels of memory hierarchy will allow more efficient programs to be written with further gains in performance.

The second-layer memory described herein will also allow large, dense associative arrays for cache memory control to be effectively implemented. This function currently requires either a large amount of real estate on CPUs or a separate cache controller chip. The ease of implementing associative memory functions in an Ovonic memory array will be facilitated by the addition of associative memory commands to the CPU instruction set. Such commands are very valuable in database management code and would improve the CPU's capabilities by orders of magnitude on certain operations.

In general, the present invention is applicable to any logical processing unit that accesses memory. The application to central processing units, as described above, is just a single example. Second-layer Ovonic memory is also suited for speeding up disk access time. One type of cache system for a hard drive is a hardware cache which consists of a dedicated memory on a disk interface card along with a dedicated logic processing device, called a disk controller, that controls caching operations. As with the CPU, Ovonic memory can be deposited as a second-layer on top of the disk controller logic to provide the disk controller with fast access to high speed, high density, non-volatile memory.

The present invention is also applicable to a computer's video display subsystem which comprises display adapter hardware, a display device (such as CRT or LCD), and display subsystem software. The adapter hardware is further comprises a controller chip, display adapter RAM memory, and ROM memory. The display subsystem feature that dictates screen performance of a state-of-the-art display subsystem is display memory size, type, and performance. Given that the display memory's performance is measured by the speed in which data can be accessed (i.e. bytes per second or bandwidth), incorporation of high speed, high density, non-volatile Ovonic second-layer memory on top of a video controller chip will provide a substantial benefit to the computer's video capabilities and support the need of future high performance systems.

Second-layer Ovonic memory is also applicable to the computer motherboard. Motherboards contain separate memory for system configuration. Battery backed SRAM is typically used for this. Motherboards also contain the BIOS operating code in EPROM, which has a slow access time. Problems with failed batteries are common on motherboards, and BIOS updates require plugging in new chips. With Ovonic memory, these functions could be implemented in a high speed, high density, rewritable, non-volatile memory that doesn't require a battery. The memory necessary for configuration and for the BIOS can thus be taken off the motherboard and incorporated on top of the CPU.

When power is lost, the state of the CPU is lost and the system must be rebated and any programs running at the time must be restarted. If all memory in the system is non-volatile, power failure management circuitry can easily stop the clock when a problem arises and continue when the power is restored. Thus no time is wasted re-initializing the system and lengthy programs do not have to be re-run. Ovonic memory is the only non-volatile memory with the speed necessary to replace all memory and register functions in the system. Hence, the non-volatile nature of the Ovonic memory will allow power management circuitry to operate more effectively and will allow power failure recovery without rebooting.

In summary, the Ovonic electrically erasable phase change memories are adapable to the present invention because Ovonic memory is high speed, high density, non-volatile memory that can be incorporated on top of a logic processing device to form a second-layer memory. Simple memory design and low temperature deposition allow these Ovonic member arrays to be incorporated on top of existing silicon logic or on top of chalcogenide Ovonic threshold switch logic. By using Ovonic memory deposited on top of a CPU chip, the real estate normally associated with embedded memory can be eliminated. The high density of Ovonic memory allows a larger amount of high speed memory to be incorporated on a logic processing chip. The result is a smaller, less expensive chip, due to the reduced chip area. The performance of this chip will be enhanced by the greater amount of memory on board. Additional benefits will also result due to the non-volatile nature of the memory.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A computational unit comprising:

a logic processing device; and a thin-film memory array deposited on top of and communicating with said logic processing device, wherein said memory array comprises:

a plurality of electrically activated, directly overwritable multibit single-cell memory elements spacedly disposed in rows and columns on said logic processing device;

each of said memory elements comprising a volume of memory material defining a single cell memory element, said memory material having a large dynamic range of electrical resistance values and can be set to one of a plurality of resistance values within said dynamic range in response to selected electrical input signals so as to provide said single cell with multibit storage capabilities, and said memory material having at least a filamentary portion that can be set to any resistance value in said dynamic range by said selected electrical signal regardless of the previous resistance value of said material;

and a pair of spacedly disposed contacts for supplying said electrical input signal to set said memory material to a selected resistance value within said dynamic range.

2. The memory element of claim 1, wherein said memory material is selected from the group consisting of Te, Se, Ge, Sb, Bi, Pb, Sn, As, S, Si, P, O and mixtures or alloys thereof.

3. The memory element of claim 2, wherein said memory material includes Te, Ge and Sb in the ratio $Te_a Ge_b Sb_{100-(a+b)}$ where the subscripts are in atomic percentages which total 100% of the constituent elements and $40 \leq a \leq 58$ and $8 \leq b \leq 40$.

4. The computational unit of claim 1, wherein said logic processing unit is an integrated circuit.

5. The computational unit of claim 4, wherein said logic processing unit comprises logic units; and device drivers.

6. The computational unit of claim 5, wherein said logic processing unit comprises a semiconductor material.

7. The computational unit of claim 6, wherein said semiconductor material is silicon.

8. The computational unit of claim 1, wherein said logic processing unit comprises a logic family employing a plurality of two-terminal chalcogenide switches as logic gates therein.

9. The computational unit of claim 8, wherein said two-terminal chalcogenide switches are chalcogenide threshold switches.

10. The computational unit of claim 8, wherein said logic family employs multi-phase clocking.

11. The computational unit of claim 10, wherein said logic family employs three-phase clocking.

12. The computational unit of claim 10, wherein said logic family employs four-phase clocking.

13. The computational unit of claim 12, wherein said four-phase clocking has a fifty percent duty cycle.

14. The computational unit of claim 8, wherein said logic family includes a logical operational circuit comprising:

a first chalcogenide threshold switch connected in series to a second chalcogenide threshold switch;

one or more input resistors each having a first and a second terminal, said first terminal of each of said one or more input resistors uniquely connected to one or more input points, said second terminal of each of said one or more input resistors connected to a junction between said first and said second threshold switches;

a circuit powering point connected to a terminal of said first threshold switch opposite said junction of said first and said second threshold switches;

a ground resistor having a first and a second terminal, said first terminal of said ground resistor connected to a terminal of said second threshold switch opposite said junction of said first and said second threshold switches, said second terminal of said ground resistor connected to ground; and a signal output terminal connected to a junction between said second threshold switch and said ground resistor.

15. The computational unit of claim 14, wherein said one or more input resistors is one input resistor.

16. A computational unit comprising:

a logic processing device comprising a logic family employing a plurality of two-terminal chalcogenide switches as logic gates therein; and a memory array deposited on top of and communicating with said logic processing device.

17. The computational unit of claim 16, wherein said two-terminal chalcogenide switches are chalcogenide threshold switches.

18. The computational unit of claim 16, wherein said logic family employs multi-phase clocking.

19. The computational unit of claim 18, wherein said logic family employs three-phase clocking.

20. The computational unit of claim 18, wherein said logic family employs four-phase clocking.

21. The computational unit of claim 20, wherein said four-phase clocking has a fifty percent duty cycle.

22. The computational unit of claim 16, wherein said logic family includes a logical operational circuit comprising:

a first chalcogenide threshold switch connected in series to a second chalcogenide threshold switch;

one or more input resistors each having a first and a second terminal, said first terminal of each of said one or more input resistors uniquely connected to one or more input points, said second terminal of each of said one or more input resistors connected to a junction between said first and said second threshold switches;

a circuit powering point connected to a terminal of said first threshold switch opposite that of said junction of said first and said second threshold switches;

a ground resistor having a first and a second terminal, said first terminal of said ground resistor connected a terminal of said second threshold switch opposite said junction of said first and said second threshold switches, said second terminal of said ground resistor connected to ground; and a signal output terminal connected between said second threshold switch and said ground resistor.

23. The computational unit of claim 22, wherein said one or more input resistors is one input resistor.

* * * * *